United States Patent
Eng et al.

(10) Patent No.: US 10,068,979 B2
(45) Date of Patent: Sep. 4, 2018

(54) PLANAR FIELD EFFECT TRANSISTOR

(71) Applicant: UNITED MICROELECTRONICS CORP., Hsin-Chu (TW)

(72) Inventors: Yi Chuen Eng, Tainan (TW);
Teng-Chuan Hu, Tainan (TW);
I-Chang Wang, Tainan (TW);
Wei-Chih Chen, Tainan (TW);
Hsiu-Kuan Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/677,035

(22) Filed: Aug. 15, 2017

(65) Prior Publication Data

US 2018/0012971 A1    Jan. 11, 2018

Related U.S. Application Data

(62) Division of application No. 14/877,926, filed on Oct. 7, 2015, now Pat. No. 9,773,880.

(30) Foreign Application Priority Data

Sep. 9, 2015 (CN) .......................... 2015 1 0568434

(51) Int. Cl.
*H01L 29/423* (2006.01)
*H01L 29/417* (2006.01)
(Continued)

(52) U.S. Cl.
CPC .... *H01L 29/42356* (2013.01); *H01L 29/0649* (2013.01); *H01L 29/41791* (2013.01); *H01L 29/66795* (2013.01); *H01L 29/785* (2013.01)

(58) Field of Classification Search
CPC ......... H01L 29/06; H01L 29/78; H01L 29/66; H01L 29/423; H01L 29/417;
(Continued)

(56) References Cited

U.S. PATENT DOCUMENTS

2012/0299099 A1    11/2012   Huang
2012/0302027 A1*   11/2012   Huang .............. H01L 29/42392
                                                          438/297
(Continued)

OTHER PUBLICATIONS

Eng, Title of Invention: Field Effect Transistor and Method for Fabricating Field Effect Transistor , U.S. Appl. No. 14/455,947, filed Aug. 11, 2014.

*Primary Examiner* — Chuong A Luu
(74) *Attorney, Agent, or Firm* — Winston Hsu

(57) ABSTRACT

A fin-shaped field effect transistor includes a substrate and a gate. The substrate includes an active area, where the active area includes a fin structure having at least an extension part protruding from the fin structure. The gate is disposed over the fin structure and directly on the extension part. The present invention also provides a planar field effect transistor including a substrate and a gate. The substrate includes an active area, where the active area includes a frame area and a penetrating area penetrating through the frame area. The gate is disposed over the active area, where the gate is directly disposed on the penetrating area, and the frame area at least at a side of the gate constitutes a source/drain surrounding an isolation island.

19 Claims, 7 Drawing Sheets

(51) Int. Cl.
*H01L 29/66* (2006.01)
*H01L 29/78* (2006.01)
*H01L 29/06* (2006.01)

(58) Field of Classification Search
CPC ........... H01L 29/42356; H01L 29/0649; H01L 29/41791; H01L 29/66795; H01L 29/785
USPC ........................................................ 257/401
See application file for complete search history.

(56) References Cited

U.S. PATENT DOCUMENTS

| | | |
|---|---|---|
| 2013/0237026 A1 | 9/2013 | Lee |
| 2014/0042491 A1* | 2/2014 | Chen ............... H01L 21/823807 257/190 |
| 2015/0102392 A1 | 4/2015 | Yu |
| 2015/0200271 A1 | 7/2015 | Lee |
| 2016/0043222 A1 | 2/2016 | Cho |
| 2016/0172445 A1 | 6/2016 | Kim |

* cited by examiner

PLANAR FIELD EFFECT TRANSISTOR

CROSS REFERENCE TO RELATED APPLICATIONS

This application is a divisional application of and claims the benefit of U.S. patent application Ser. No. 14/877,926, filed Oct. 7, 2015 now U.S. Pat. No. 9,773,880.

BACKGROUND OF THE INVENTION

1. Field of the Invention

The present invention relates generally to a semiconductor process, a planar field effect transistor and a fin-shaped field effect transistor, and more specifically to a semiconductor process, a planar field effect transistor and a fin-shaped field effect transistor including extension parts enlarging gate channels.

2. Description of the Prior Art

Metal-Oxide-Semiconductors (MOS) transistors are widely used transistors. Current transistor includes a gate, a source and a drain. The source and the drain are respectively located in a substrate, and the gate is located on the substrate between the drain and the source, to control the switching of currents in a gate channel below the gate and sandwiched by the source and the drain. Generally, transistors may be divided into planar transistors and non-planar transistors.

With increasing miniaturization of semiconductor devices, various non-planar transistors such as multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

A multi-gate MOSFET may include a fin structure, and the gate is disposed over the fin structure to form the multi-gate MOSFET different from a planar transistor. A height of the fin structure and a width of the gate disposed over the fin structure affect the width and the length of the gate channel of the multi-gate MOSFET.

As the integration of integrated circuits enhances, leading to property limitations such as material and process limitations, new transistors such as planar or non-planar transistors are developed in the industry to increase density of transistors on a substrate as well as current between sources and drains.

SUMMARY OF THE INVENTION

The present invention relates generally to a semiconductor process, a planar field effect transistor and a fin-shaped field effect transistor, which forms an extension part protruding from a fin structure of the fin-shaped field effect transistor or protruding from a frame area of the planar field effect transistor, thereby enlarging gate channels and enhancing operation speed of transistors.

The present invention provides a semiconductor process including the following steps. A substrate including an active area is provided. A first etching process is performed to pattern the substrate of the active area to form a top of a fin structure. A mask covers a preservation area of the substrate. A second etching process is performed to etch the substrate and deepen the top of the fin structure but preserve the preservation area, thereby forming the fin structure having an extension part protruding from the fin structure. The mask is removed. A gate is formed over the fin structure, wherein the gate is directly on the extension part.

The present invention provides a planar field effect transistor including a substrate and a gate. The substrate includes an active area, wherein the active area includes a frame area and a penetrating area penetrates the frame area. The gate is disposed over the active area, wherein the gate is directly on the penetrating area, and the frame area on at least one side of the gate constitutes a source/drain and surrounds an isolation island.

The present invention provides a fin-shaped field effect transistor including a substrate and a gate. The substrate includes an active area, wherein the active area includes a fin structure having at least an extension part protruding from the fin structure. The gate is disposed over the fin structure, wherein the gate is directly disposed on the extension part.

According to the above, the present invention provides a semiconductor process, a planar field effect transistor and a fin-shaped field effect transistor, which forms an extension part beside a fin structure of the fin-shaped field effect transistor or an extension area beside a frame area of the planar field effect transistor, and forms a gate directly disposed over the extension part or the extension area. Thereby, extra gate channel can generate in the contact area between the extension part and the fin structure, or the contact area between the extension area and the frame area, thus enlarging the whole gate channel, increasing electrical current between a source and a drain, and enhancing operation speed of a formed transistor. Meanwhile, the capability of controlling the gate channel can be ensured.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
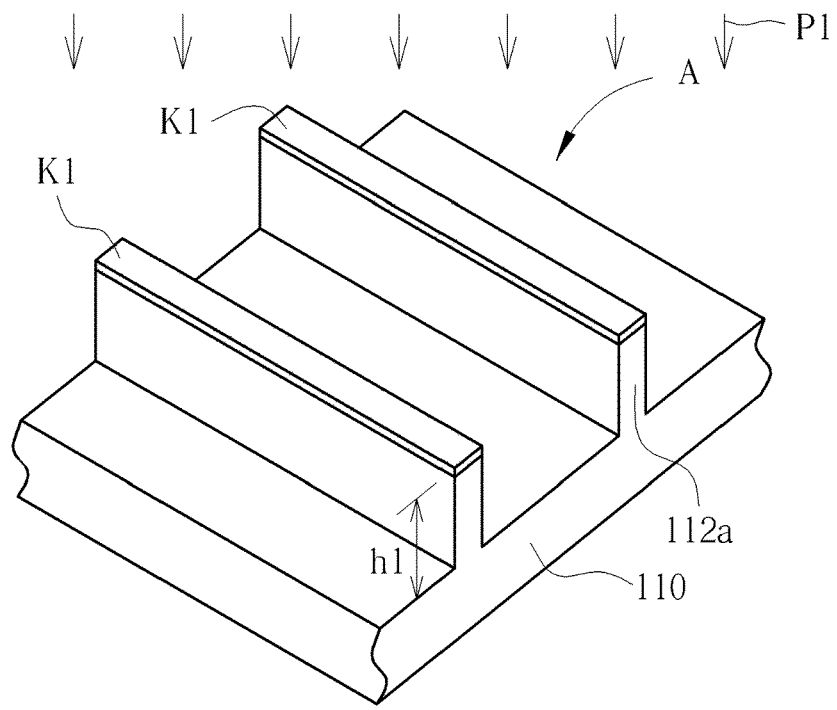
FIGS. 1-5 schematically depict three dimensional diagrams of a semiconductor process according to an embodiment of the present invention.

FIGS. 1-5 schematically depict three dimensional diagrams of a semiconductor process according to an embodiment of the present invention. As shown in FIG. 1, a substrate 110 having an active area A is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this embodiment, the substrate 110 is a bulk silicon substrate, but it is not limited thereto. Masks K1 may cover the substrate 110 to define areas desired for forming fin structures, wherein the masks K1 may be a patterned nitride layer, but it is not limited thereto. A first etching process P1 may be performed to pattern the active area A of the substrate 110, thereby tops 112a of later formed fin structures being formed. The first etching process P1 is preferably a dry etching process, which provides an almost vertical etching according to anisotropic characteristic, thereby forming the tops 112a of the later formed fin structures, wherein the tops 112a may have vertical sidewalls or have narrow trapezoid sidewalls widen from top to bottom. In this embodiment, two tops 112a of the fin structures are depicted, but the number of the tops 112a is not restricted thereto.

Figure 2:
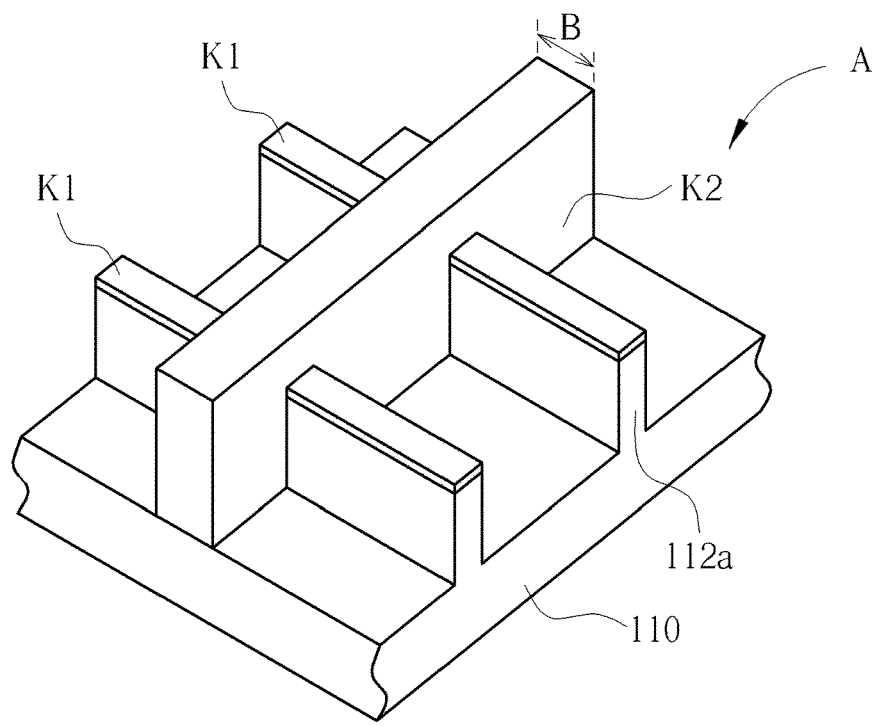

As shown in FIG. 2, a mask K2 may cover a preservation area B of the substrate 110. The mask K2 is preferably orthogonal to the tops 112a of the fin structures, but it is not limited thereto. The masks K1 are preserved as covering the mask K2, thereby the substrate 110 right below the masks K1 and the mask K2 are preserved. The mask K2 may be a patterned nitride layer or a photoresist, but it is not limited thereto. In one case, the masks K1 and the mask K2 are preferably common materials while the masks K1 and the mask K2 are removed simultaneously in later processes. In this embodiment, the masks K1 are nitride layers, while the mask K2 is a photoresist.

Figure 3:
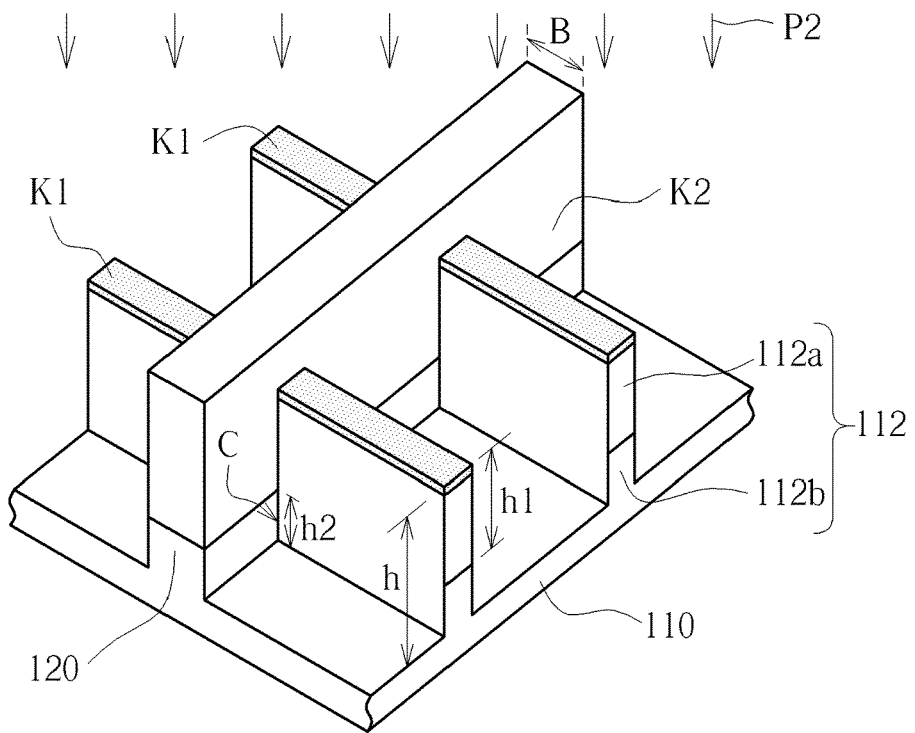

As shown in FIG. 3, a second etching process P2 is performed to etch the substrate 110 other than the masks K1 and the mask K2, to deepen the depths of the tops 112a, thereby fin structures 112 having the tops 112a and bottoms 112b being formed. Meanwhile, the substrate 110 of the preservation area B right below the mask K2 is preserved, thereby an extension part 120 protruding from the fin structures 112 being formed. By doing this, the fin structures 112 and the extension part 120 are all composed of same bulk silicon substrate and have common materials, thereby being one piece.

The second etching process P2 is preferably a dry etching process, which provides an almost vertical etching according to anisotropic characteristic, thereby forming the fin structures 112 and the extension part 120 having narrow trapezoid sidewalls widen from top to bottom or vertical sidewalls. In this embodiment, the extension part 120 protruding from each of the fin structures 112 merges into one piece and connects each of the fin structures 112, but it is not limited thereto. In other embodiments, the extension part 120 is located between each of the fin structures 112, but does not connect each of the fin structures 112. In a preferred embodiment, the mask K2 is orthogonal to the tops 112a of the fin structures 112, therefore the extension part 120 right below the mask K2 is orthogonal to the fin structures 112, but it is not limited thereto.

It is emphasized that, a height h2 of the extension part 120 must be less than a height h of each of the fin structures 112, and the height h2 of the extension part 120 is substantially equal to the height of the bottom 112b of each of the fin structures 112. Furthermore, the height h2 of the extension part 120 formed by the second etching process P2 as shown in FIG. 3 and the height h of the fin structures 112 can be determined, by adjusting the depth etching by the first etching process P1 of FIG. 1, meaning a height h1 of each of the tops 112a. In a preferred embodiment, the height h1 of each of the tops 112a is a half the height h of each of the fin structures 112. In other words, the height h2 of the extension part 120 is equal to the height h1 of the top 112a of each of the fin structures 112, and the height h2 of the extension part 120 is equal to a half the height h of each of the fin structures 112. By doing this, short channel effect can be avoided, and large resistance can be avoided as well. In other preferred embodiments, the height h2 of the extension part 120 is preferably one-fourth to a half the height h of the fin structures 112, but it is not limited thereto. In this embodiment, the fin structures 112 and the extension part 120 protruding from the fin structures 112 are formed by the etching steps of FIGS. 1-3, but it is not limited thereto. The three-dimensional structure of the present invention, which includes the fin structures 112 and the extension part 120 protruding from the fin structures 112, may be formed by other methods instead, wherein the height h2 of the extension part 120 must be less than the height h of each of the fin structures 112. In this way, extra gate channels can be formed in contact areas C of the extension part 120 and the fin structures 112 as a gate is disposed over the fin structures 112 and directly on the extension part 120. Hence, the whole gate channels can be enlarged. Besides, the whole gate channels can be well-controlled because of each of the fin structures 112 sandwiched by the gate through three sides.

Figure 4:
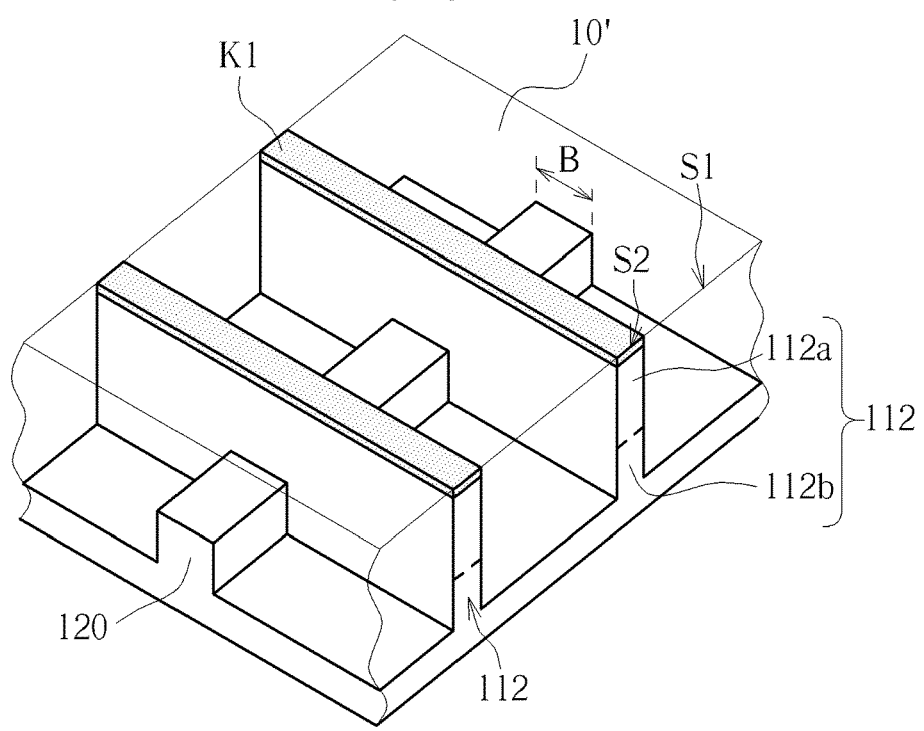
Figure 5:
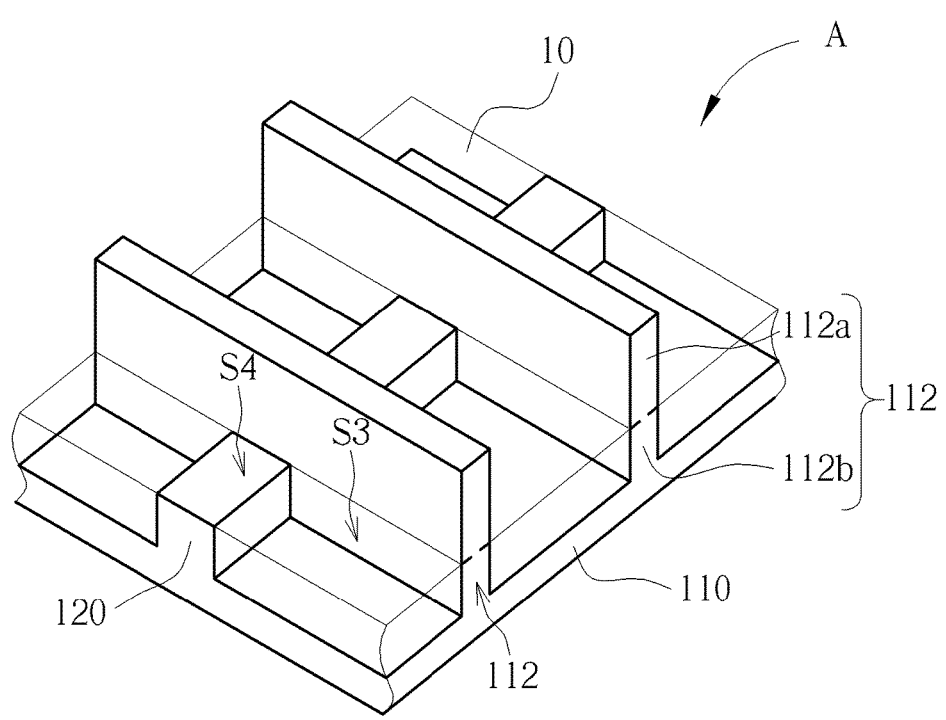

Please refer to FIGS. 4-5, an isolation structure 10 is formed beside the fin structures 112 and the extension part 120. The isolation structure 10 may be a shallow trench isolation (STI) structure, which is formed by a shallow trench isolation process, but it is not limited thereto. More precisely, the mask K2 may be removed. Then, the steps of forming the isolation structure 10 beside the fin structures 112 and the extension part 120 may be the steps shown in FIGS. 4-5, but the present invention is not restricted thereto. As shown in FIG. 4, an isolation material (not shown) may cover blanketly and be planarized until the masks K1 are exposed, thereby an isolation material 10' having a flat top surface S1 can be formed, and the flat top surface S1 trims with top surfaces S2 of the masks K1. The isolation material 10' is etched until the extension part 120 is exposed, thereby the isolation structure 10 being formed, wherein a top surface S3 of the isolation structure 10 trims with a top surface S4 of the extension part 120, as shown in FIG. 5. Thereafter, the masks K1 are removed.

In this case, after the fin structures 112 and the extension part 120 protruding from the fin structures 112 are formed, the masks K1 can be preserved to serve as planarizing and etching stop layers while forming the isolation structure 10, and then the masks K1 are removed to prevent the fin structures 112 from damage while planarizing and etching. In other cases, after the fin structures 112 and the extension part 120 protruding from the fin structures 112 are formed, the masks K1 and the mask K2 may be removed immediately, thus the fin structures 112 and the extension part 120 may serve as planarizing and etching stop layers respectively according to materials difference between the fin structures 112 and the extension part 120 composed of silicon, and the isolation structure 10 composed of oxide while forming the isolation structure 10 as shown in FIGS. 4-5, but it is not limited thereto.

Above all, the present invention forms the fin structures 112 and the extension part 120 protruding from the fin structures 112 by several steps etching processes. Thereafter, a gate can be disposed over the fin structures 112 and the extension part 120, and then source/drains can be formed in the fin structures 112, and interconnect structure forming processes can be carried out. As a result, enlarging gate channels can be formed and well-controlled, and the layout density of formed fin-shaped field effect transistors can be maintained. The follow-up steps such as the steps of forming the gate disposed over the fin structures 112 and the extension part 120, forming the source/drains in the fin structures 112, and building the interconnect structures can be compatible with modern fin-shaped field effect transistor processes, and thus the present invention is easily adapted to be widely utilized.

Two embodiments including three-view diagrams of fin-shaped field effect transistors are presented, wherein each of the three-view diagrams includes a top view and two cross-sectional views orthogonal to each other.

Figure 6:
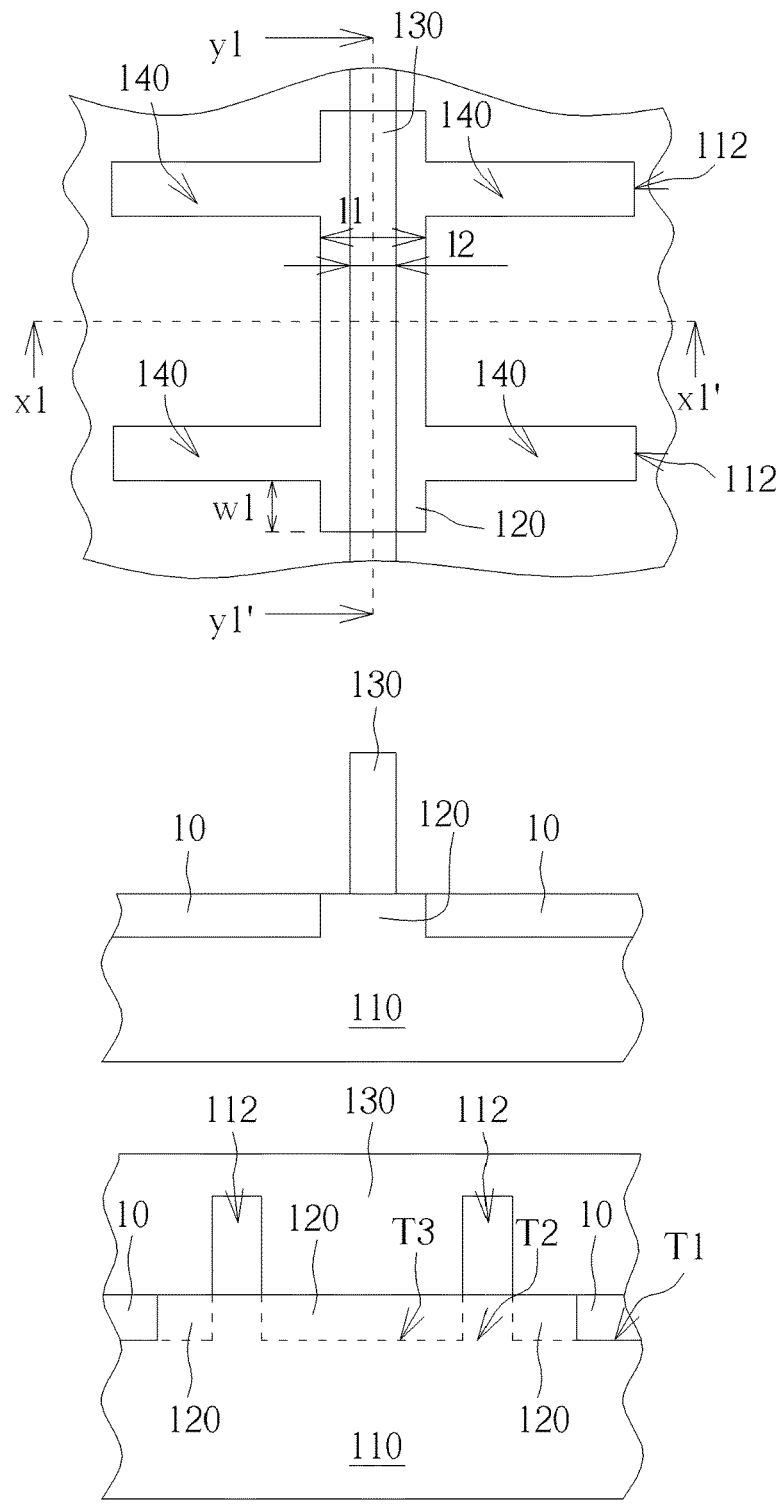
FIG. 6 schematically depicts a three-view diagram of a fin-shaped field effect transistor on a bulk substrate according to an embodiment of the present invention.

FIG. 6 schematically depicts a three-view diagram of a fin-shaped field effect transistor on a bulk substrate according to an embodiment of the present invention. Please refer to FIGS. 1-5, after the fin structures 112 and the extension part 120 protruding from the fin structures 112 are formed, a gate 130 is disposed over the fin structures 112 and directly located on the extension part 120, wherein the gate 130 may include a gat conductive layer and a gate dielectric layer, and the gate dielectric layer directly contacts the extension part 120 and the fin structures 112. The top diagram of FIG. 6 depicts the gate 130 disposed over the fin structures 112, and directly located on the extension part 120, and a length l1 of the extension part 120 is larger than a length l2 (meaning a gate channel length) of the gate 130. In a preferred embodiment, the length l1 of the extension part 120 is two times the length l2 of the gate 130. In this way, tolerance of misaligning the gate 130 is reserved, thereby the gate 130 exceeding the extension part 120 being avoided. A width w1 of the extension part 120 is preferably equal to the length l2 of the gate 130, wherein the width w1 is the maximum width of an extra gate channel that currents can approach. In other words, as the width w1 of the extension part 120 is equal to the length l2 of the gate 130, layout areas can be saved, and the efficient maximum width can be achieved. An ion implantation process may be performed to form source/drains 140 in the fin structures 112 beside the gate 130, wherein dopants of the source/drains 140 depend upon the electrical types and demands of formed transistors. The middle diagram of FIG. 6 is a cross-sectional view along x1x1' line of the top diagram of FIG. 6, wherein the middle diagram depicts the gate 130 is directly located on the extension part 120 and does not exceed the extension part 120 to contact the isolation structure 10. The bottom diagram of FIG. 6 is a cross-sectional view along y1y1' line of the top diagram of FIG. 6, wherein the bottom diagram depicts the extension part 120 is lower than the fin structures 112, the gate 130 is disposed over the fin structures 112 and is directly located on the extension part 120, wherein the dashed-line is used for representing the extension part 120, the fin structures 112 and the isolation structure 10, but does not actually exist in real structures. Due to the fin-shaped field effect transistors being formed on a bulk substrate in this embodiment, the fin structures 112 and the extension part 120 directly connect the bulk substrate 110, and a bottom T1 of the isolation structure 10 trims with bottoms T2 of the fin structures 112 and a bottom T3 of the extension part 120.

Figure 7:
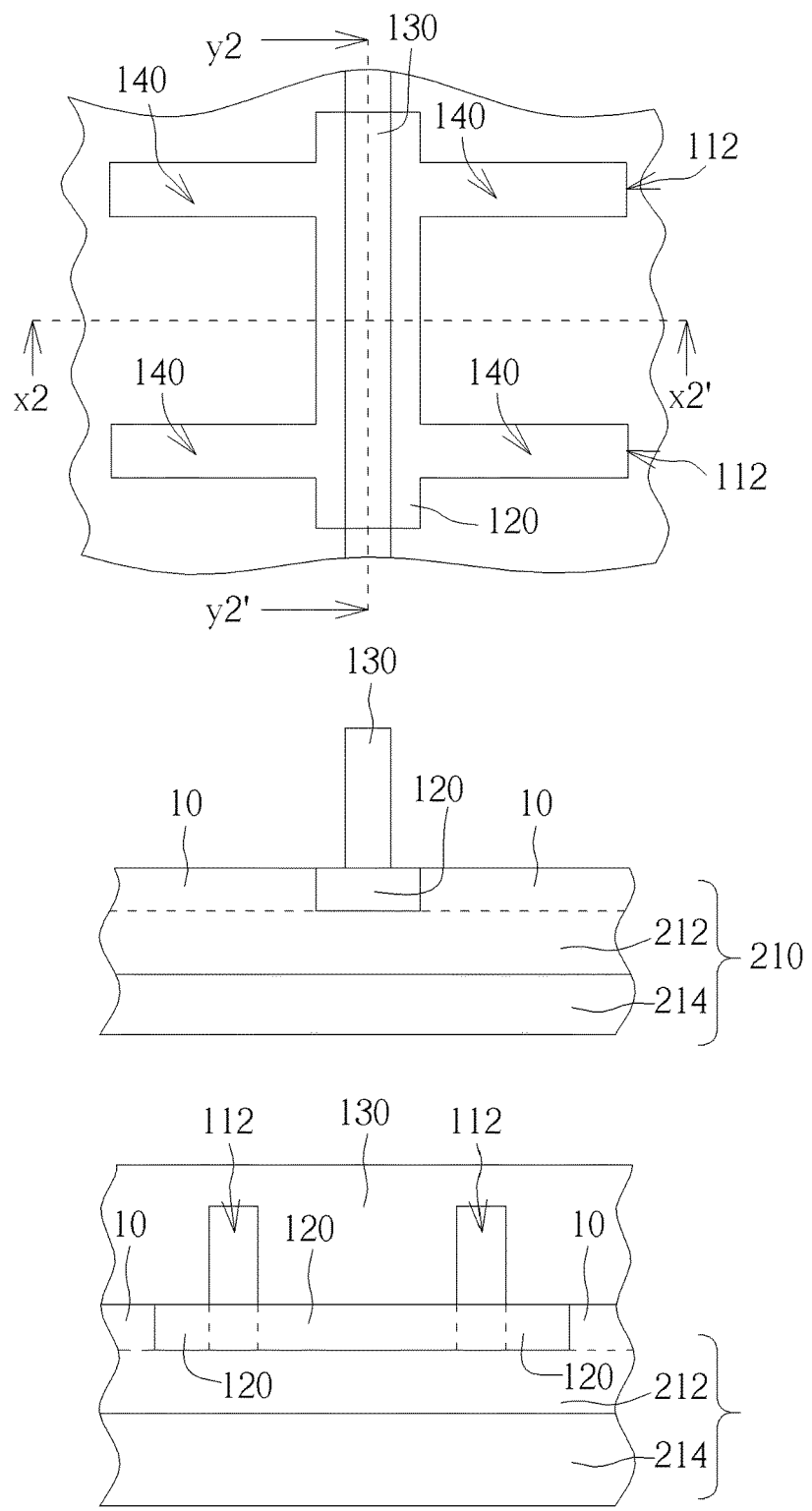
FIG. 7 schematically depicts a three-view diagram of a fin-shaped field effect transistor on a silicon-on-insulator substrate according to an embodiment of the present invention.

FIG. 7 schematically depicts a three-view diagram of a fin-shaped field effect transistor on a silicon-on-insulator substrate according to an embodiment of the present invention. The previous process of this embodiment is common to the process of FIGS. 1-5. That is, after the fin structures 112 and the extension part 120 protruding from the fin structures 112 are formed, a gate 130 is disposed over the fin structures 112, and is directly on the extension part 120, thereby the top diagram of FIG. 7 being common to the top diagram of FIG. 6. The difference between this embodiment and the embodiment of FIG. 6 is depicted in the middle diagram of FIG. 7 (which is a cross-sectional view along x2x2' line of the top diagram of FIG. 7) and the bottom diagram of FIG. 7 (which is a cross-sectional view along y2y2' line of the top diagram of FIG. 7). In this case, the extension part 120 and the fin structures 112 are located on a silicon-on-insulator substrate 210. More precisely, the silicon-on-insulator substrate 210 is an oxide layer 212 sandwiched by a bottom silicon layer 214 and a top silicon layer. The extension part 120 and the fin structures 112 may be a remaining part of the top silicon layer after patterning, so that the extension part 120 and the fin structures 112 are located on the oxide layer 212. The isolation structure 10 is formed on the oxide layer 212 beside the extension part 120 and the fin structures 112, wherein the dashed-line is utilized for representing the oxide layer 212 and the isolation structure 10. Since the isolation structure 10 and the oxide layer 212 are composed of oxide, but both are formed by different methods, a micro-interface between them exists.

According to the above, the embodiments of fin-shaped field effect transistors applying the present invention are presented, but the present invention can also be applied in planar field effect transistors.

Figure 8:
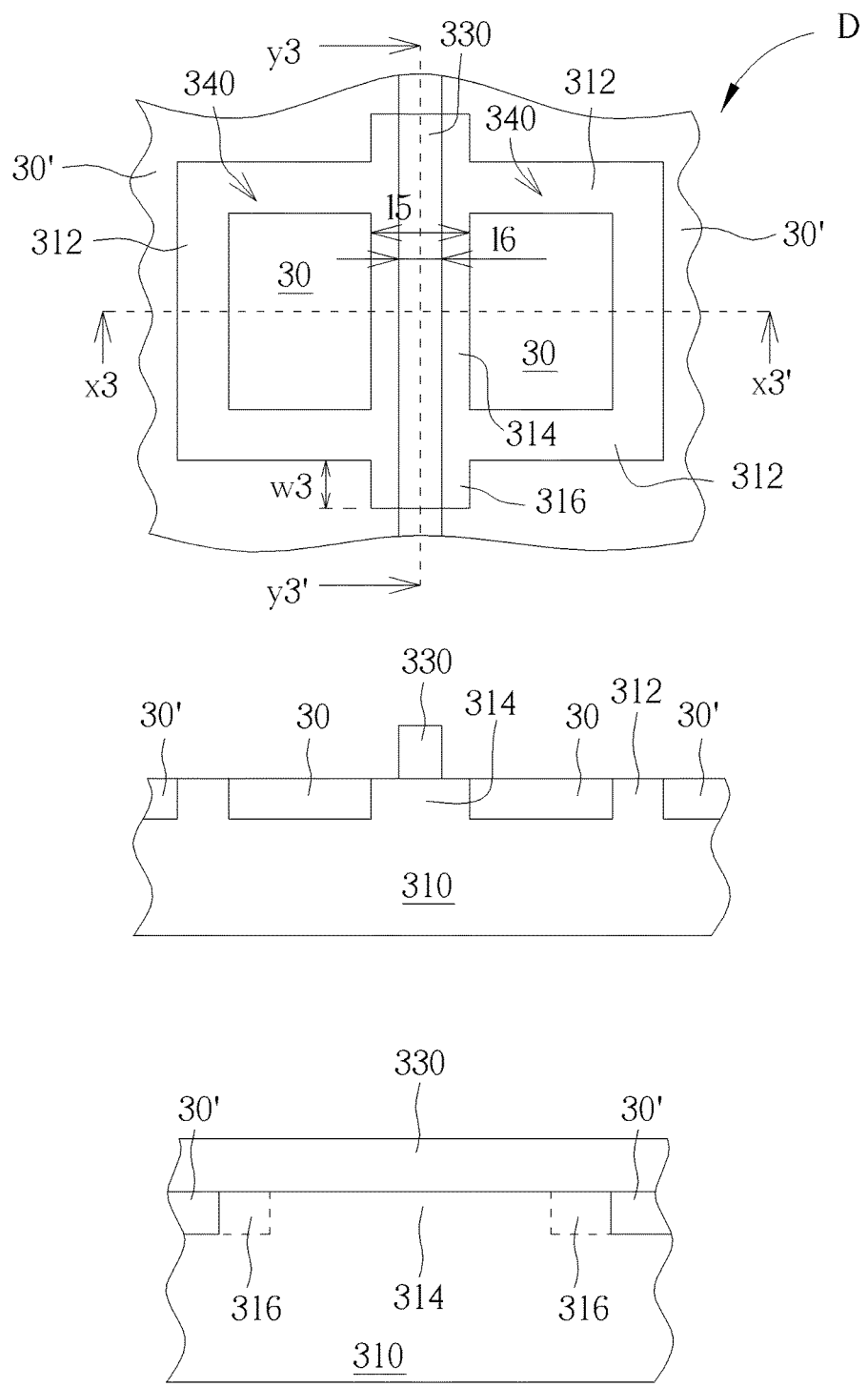
FIG. 8 schematically depicts a three-view diagram of a planar field effect transistor on a bulk substrate according to an embodiment of the present invention.

FIG. 8 schematically depicts a three-view diagram of a planar field effect transistor on a bulk substrate according to an embodiment of the present invention. The top diagram of FIG. 8 depicts a top view, the middle diagram of FIG. 8 depicts a cross-sectional view along x3x3' line, and the bottom diagram of FIG. 8 depicts a cross-sectional view along y3y3' line. As shown in FIG. 8, a substrate 310 is provided. The substrate 310 may be a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers, but it is not limited thereto. In this embodiment, the substrate 310 is a bulk silicon substrate, but it is not limited thereto. The substrate 310 may include an active area D. The active area D may include a frame area 312, a penetrating area 314 and two extension areas 316. The penetrating area 314 penetrates through the frame area 312, and the two extension areas 316 extend from the penetrating area 314 and protrude from the frame area 312. As this embodiment is a planar field effect transistor embodiment, the frame area 312, the penetrating area 314 and the extension areas 316 are located in one same planar. The frame area 312, the penetrating area 314 and the extension areas 316 may be formed by patterning a bulk silicon substrate through etching once, but it is not limited thereto. Thus, recesses (not shown) are formed after patterning, and then an isolation material fills the recesses, thereby isolation islands 30 being formed inside the frame area 312, and an isolation structure 30' being formed outside the frame area 312. The isolation islands 30 and the isolation structure 30' may be shallow trench isolation (STI) structures, which may be formed by a shallow trench isolation (STI) process, but it is not limited thereto. Furthermore, as shown in the illustrated embodiment of FIG. 8, the frame area 312 is a rectangular frame structure of a portion of the substrate 310 under the top view (the top diagram of FIG. 8), the penetrating area 314 is a penetrating elongated region of another portion of the substrate 310 as shown by the top diagram, the middle diagram, and the bottom diagram, respectively, and the extension area 316 is an extension region of yet another portion of the substrate 310 as shown by the top diagram and the bottom diagram, respectively; the extension area 316 extends longer than the penetrating area 314 along y3y3' line.

In this embodiment, two extension areas 316 extend from two ends of the penetrating area 314 and protrude from the frame area 312, but the number of the extension areas 316 is not restricted thereto. In other embodiments, the extension area 316 may be single, which can extend from one end of the penetrating area 314 and protrude from the frame area 312, but it is not limited thereto.

A gate 330 is disposed over the active area D, and the gate 330 is directly on the penetrating area 314 and the extension areas 316. In a preferred embodiment, the whole gate 330 is directly disposed on the penetrating area 314 and the extension areas 316, but does not contact the isolation islands 30 as well as the isolation structure 30'. In a preferred embodiment, lengths l5 of the penetrating area 314 and the extension areas 316 are larger than a length l6 of the gate 330. In a still preferred embodiment, the lengths l5 of the penetrating area 314 and the extension areas 316 are two times the length l6 of the gate 330. In this way, tolerance of misaligning the gate 330 can be reserved, thereby avoiding the gate 330 from exceeding the penetrating area 314 and the extension areas 316. A width w3 of the extension parts 316 is preferably equal to the length l6 of the gate 330, wherein the width w3 is the maximum width of an extra gate channel that currents can approach. In other words, as the width w3 of the extension parts 316 is equal to the length l6 of the gate 130, layout areas can be saved, and the efficient maximum width can be achieved. An ion implantation process may be performed to form a source/drain 340 in the frame area 312 beside the gate 330, wherein dopants of the source/drain 340 depend upon the electrical types and demands of formed transistors. The source/drain 340 surrounds the isolation islands 30.

Figure 9:
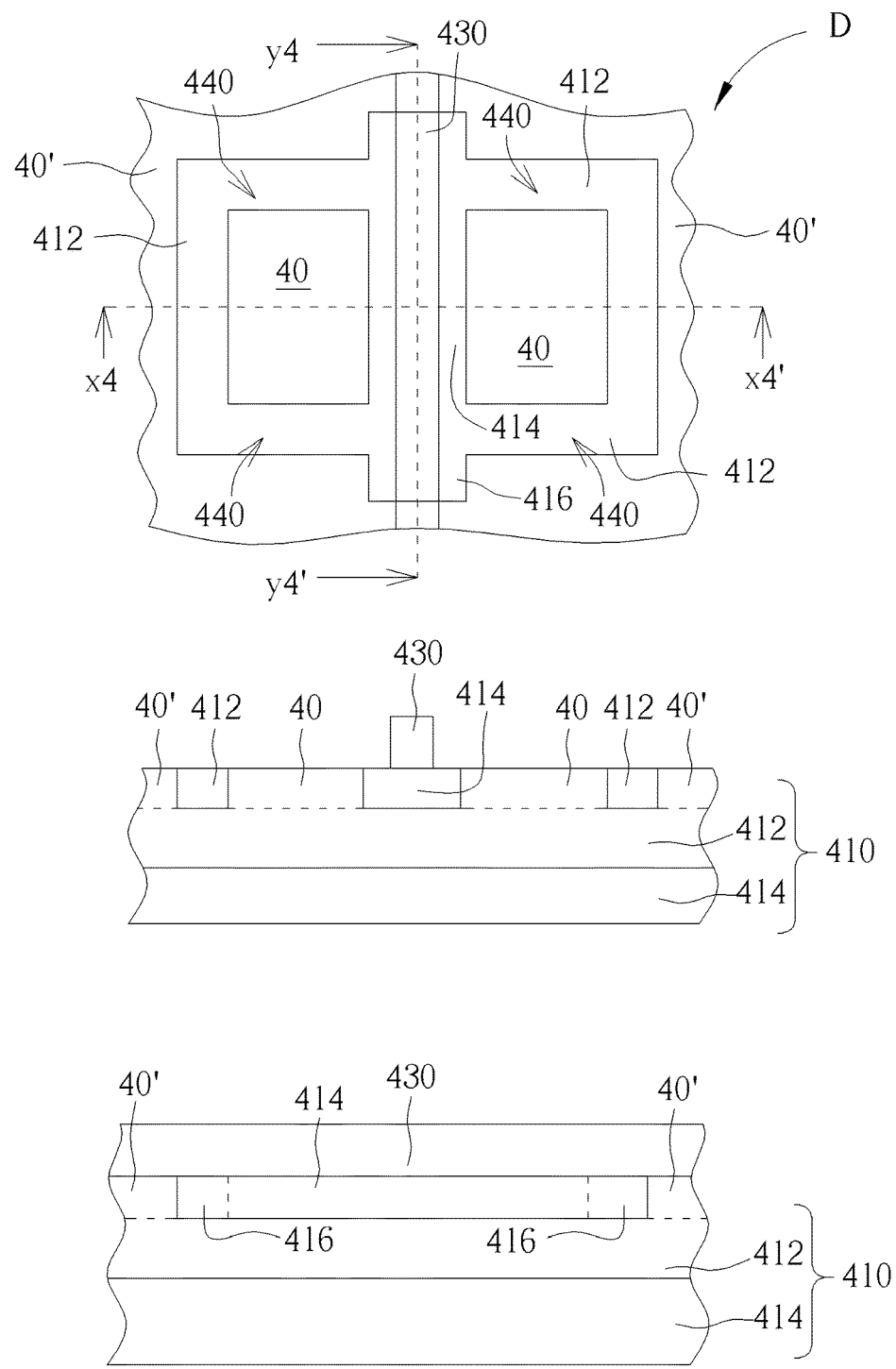
FIG. 9 schematically depicts a three-view diagram of a planar field effect transistor on a silicon-on-insulator substrate according to an embodiment of the present invention.

FIG. 9 schematically depicts a three-view diagram of a planar field effect transistor on a silicon-on-insulator substrate according to an embodiment of the present invention. The top diagram of FIG. 9 depicts a top view, the middle diagram of FIG. 9 depicts a cross-sectional view along x4x4' line, and the bottom diagram of FIG. 9 depicts a cross-sectional view along y4y4' line. The process of this embodiment is similar to the process of the embodiment of FIG. 8. The difference between this embodiment and the embodiment of FIG. 8 is depicted in the middle diagram of FIG. 9 and the bottom diagram of FIG. 9. In this case, a frame area 412, a penetrating area 414 and two extension areas 416 are located on a silicon-on-insulator substrate 410. More precisely, the silicon-on-insulator substrate 410 includes an oxide layer 412 sandwiched by a bottom silicon layer 414 and a top silicon layer. The frame area 412, the penetrating area 414 and the two extension areas 416 may be a remaining part of the top silicon layer after patterning, so that the frame area 412, the penetrating area 414 and the two extension areas 416 are located on the oxide layer 412. Isolation islands 40 are formed inside the frame area 412, wherein the dashed-line represents the oxide layer 412, the isolation islands 40 and an isolation structure 40'. Since the isolation islands 40, the isolation structure 40' and the oxide layer 412 are all composed of oxide, but are formed by different methods, a micro-interface exists between the isolation islands 40 and the oxide layer 412 and between the isolation structure 40' and the oxide layer 412.

To summarize, the present invention provides a semiconductor process, a planar field effect transistor and a fin-shaped field effect transistor, which forms an extension part beside a fin structure of the fin-shaped field effect transistor or an extension area beside a frame area of the planar field effect transistor, and forms a gate disposed over the extension part or the extension area. Thereby, an extra gate channel can generate in the contact area between the extension part and the fin structure, or the contact area between the extension area and the frame area, thus enlarging the whole gate channel, increasing electrical current between a source and a drain, and enhancing operation speed of transistors. Meanwhile, the capability of controlling the gate channel can be ensured.

Moreover, as the present invention is applied for forming a fin-shaped field effect transistor, a fin structure and an extension part protruding from the fin structure may be formed by etching twice utilizing masks, wherein a height of the extension part is less than a height of the fin structure. Then, a gate is disposed over the fin structure and is directly on the extension part. A source/drain may be formed in the fin structure beside the gate. In addition, as the present invention is applied for forming a planar field effect transistor, a hollow active area having isolation islands therein can be formed by etching once. That is, a substrate may be patterned to form a frame area, a penetrating area and at least an extension area. The penetrating area penetrates through the frame area, and the extension area extends from the penetrating area and protrudes from the frame area, wherein the frame area, the penetrating area and the extension area are located in one same plane. Thereafter, a gate is formed directly on the penetrating area and the extension area. A source/drain is formed in the frame area beside the gate. By applying the present invention, extra gate channels can be formed either in a contact area of the extension part and the fin structure, or in a contact area of the extension area and the frame area. As a result, the present invention enlarges the whole gate channels, increases currents flowing between source/drains, and enhances operation speed of formed transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planar field effect transistor, comprising:
    a substrate, comprising an active area, wherein the active area comprises a frame area,
    a penetrating area penetrating the frame area and at least an extension area protruding from the frame area, wherein the frame area is a rectangular frame structure of a portion of the substrate under top view, the penetrating area is a penetrating elongated region of another portion of the substrate, and the extension area is an extension region of yet another portion of the substrate; and
    a gate disposed over the active area, wherein the gate is directly on the penetrating area.

2. The planar field effect transistor according to claim 1, wherein the extension area extends from the penetrating area.

3. The planar field effect transistor according to claim 2, wherein single extension area extends from one end of the penetrating area and protrudes from the frame area.

4. The planar field effect transistor according to claim 2, wherein two of the extension areas extend from two ends of the penetrating area and protrude from the frame area.

5. The planar field effect transistor according to claim 2, wherein the penetrating area and the extension area have common heights.

6. The planar field effect transistor according to claim 5, wherein a top surface of the penetrating area trims a top surface of the extension area.

7. The planar field effect transistor according to claim 5, wherein the frame area, the penetrating area and the extension area have common heights.

8. The planar field effect transistor according to claim 7, wherein the frame area, the penetrating area and the extension area are located in one same plane.

9. The planar field effect transistor according to claim 8, wherein a top surface of the frame area trims a top surface of the penetrating area and a top surface of the extension area.

10. The planar field effect transistor according to claim 2, wherein lengths of the penetrating area and the extension area are larger than a length of the gate.

11. The planar field effect transistor according to claim 10, wherein the length of the penetrating area is twice the length of the gate.

12. The planar field effect transistor according to claim 2, wherein a width of the extension area equals to a length of the gate.

13. The planar field effect transistor according to claim 2, wherein the frame area on at least one side of the gate constitutes a source/drain.

14. The planar field effect transistor according to claim 13, wherein the frame area on at least one side of the gate surrounds an isolation island.

15. The planar field effect transistor according to claim 14, wherein the whole gate is directly disposed on the penetrating area and the extension area without contacting the isolation island.

16. The planar field effect transistor according to claim 14, wherein a top surface of the isolation island trims a top surface of the penetrating area.

17. The planar field effect transistor according to claim 16, wherein a top surface of the isolation island trims a top surface of the extension area.

18. The planar field effect transistor according to claim 1, wherein the frame area, the penetrating area and the extension area are one piece.

19. The planar field effect transistor according to claim 1, wherein the planar field effect transistor comprises two of the active areas, and the two extension areas of the active areas merge into one piece.

* * * * *